United States Patent [19]
Anderson et al.

[11] Patent Number: 5,160,899
[45] Date of Patent: Nov. 3, 1992

[54] ADAPTABLE MOS CURRENT MIRROR

[75] Inventors: Janeen D. W. Anderson, Fremont; Carver A. Mead, Pasadena; Timothy P. Allen, Los Gatos; Michael F. Wall, Sunnyvale, all of Calif.

[73] Assignee: Synaptics, Incorporated, San Jose, Calif.

[21] Appl. No.: 781,503

[22] Filed: Oct. 22, 1991

Related U.S. Application Data

[63] Continuation of Ser. No. 525,764, May 18, 1990, Pat. No. 5,059,920, which is a continuation-in-part of Ser. No. 486,336, Feb. 28, 1990, Pat. No. 5,068,622, which is a continuation-in-part of Ser. No. 282,176, Dec. 9, 1988, Pat. No. 4,935,702.

[51] Int. Cl.$^5$ .................. H03F 3/16; H03K 5/153
[52] U.S. Cl. .................. 330/288; 307/346; 307/351
[58] Field of Search .................. 330/277, 288, 307; 307/246, 350, 351; 323/315-317

[56]  References Cited

U.S. PATENT DOCUMENTS 5,059,814 10/1991 Mead et al. .................. 307/201

Primary Examiner—James B. Mullins
Attorney, Agent, or Firm—Kenneth D'Alessandro

[57] ABSTRACT

An adaptable current mirror includes first and second MOS transistors. The first MOS transistor has its gate connected to its drain. A MOS capacitor structure is connected in series between the gate of the first MOS transistor and the gate of the second MOS transistor. Electrons may be placed onto and removed in an analog manner from a floating node associated with the second MOS transistor, usually the gate of the transistor, by application of first and second electrical control signals. A first electrical control signal controls the injection of electrons onto the floating node from an electron injection structure and the second electrical control signal controls the removal of electrons from the floating node by an electron removal structure. A plurality of adaptable current mirrors communicating with a plurality of current-carrying lines may be employed for indicating the output of the one of the plurality of current-carrying lines through which the most current is flowing.

5 Claims, 12 Drawing Sheets

ADAPTABLE MOS CURRENT MIRROR

This application is a continuation of co-pending application Ser. No. 07/525,764, filed May 18, 1990, now U.S. Pat. No. 5,059,920, which is a continuation-in-part of co-pending application Ser. No. 486 336, filed Feb. 28, 1990, now U.S. Pat. No. 5,068,622, which is a continuation-in-part of application Ser. No. 282,176, filed Dec. 9, 1988, now U.S. Pat. No. 4,935,702.

BACKGROUND OF THE INVENTION

1. Field Of The Invention

The present invention relates to analog electronic circuits. More specifically, the present invention relates to analog silicon structures for performing the long term learning function in neural networks. The present invention relates to floating gate MOS structures for performing the learning function of analog values, long term storage of those values, and a family of circuits which electrically control the learning rate and learned analog values.

2. The Prior Art

It has recently become apparent that large-scale analog circuits can be achieved using conventional CMOS technology. The key to achieving very high levels of complexity in an analog system is to operate the individual transistors in their subthreshold region, where the drain current is an exponential function of the gate-source voltage. In this regime of operation, amplifiers can be operated with current levels in the range from $10^{-12}$ A to $10^{-7}$ A. At these low currents, the drain current of the individual transistors saturates at drain voltages above 100 to 200 MV, allowing analog operation with the same power-supply voltages commonly employed for digital circuits (0–5 V in 1990). Because of the low power-supply voltage and low current level, the total power dissipated by an individual amplifier is extremely small, making possible large-scale systems employing $10^4$ or more amplifiers.

Despite the numerous advantages of subthreshold operation, very few systems outside of the electronic watch industry have taken advantage of this mode of operation. The major problems that have prevented application of subthreshold amplifiers have been their input offset voltage and the limited input voltage range.

BRIEF DESCRIPTION OF THE INVENTION

The present invention addresses both the input range and input offset problems, and makes possible the adaptation of analog CMOS technology to a much wider range of applications.

In a first aspect of the present invention, electrons may be placed onto and removed from a floating node associated with at least one MOS insulated gate field effect transistor, usually the gate of the transistor, in an analog manner, by application of first and second electrical control signals. A first electrical control signal controls the injection of electrons onto the floating node from an electron injection structure and the second electrical control signal controls the removal of electrons from the floating node by an electron removal structure.

In another aspect of the present invention, an analog MOS integrated circuit comprises an amplifier circuit having a gain larger than 1. The inverting input into one stage of this amplifier circuit is a floating node forming the gate of at least one MOS transistor. A first capacitor couples an input of the circuit to this floating node. Electrical semiconductor structures are provided for both adding and removing charge from the floating gate, thus allowing the offset voltage of the amplifier to be adapted.

According to a third aspect of the present invention, an MOS current mirror includes a floating node onto which and from which electrons may be transported by control signals and electrical semiconductor structures.

BRIEF DESCRIPTION OF THE DRAWINGS

FIGS. 3b–3f are several structural implementations of the device of FIG. 3a.

DETAILED DESCRIPTION OF A PREFERRED EMBODIMENT

Figure 1A:
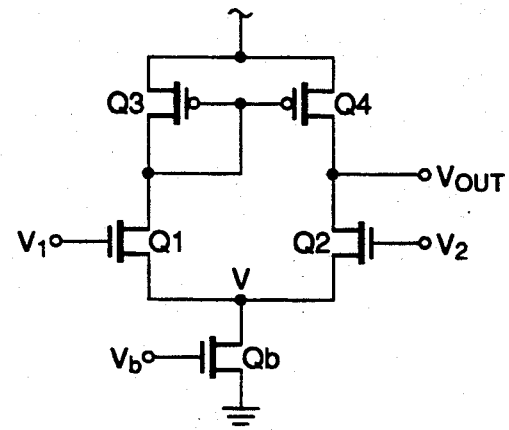
FIGS. 1a–1d are schematic diagrams and transfer curves of prior art CMOS transconductance amplifiers.
Figure 1B:
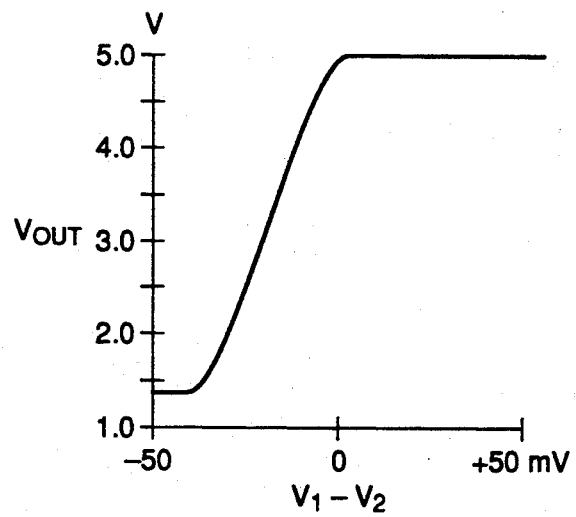

Referring first to FIG. 1a, a typical CMOS transconductance amplifier as known in the prior art is shown. FIG. 1b is a transfer curve for the amplifier circuit of FIG. 1a. FIG. 1b illustrates a typical input-offset voltage condition which is characteristic of the amplifier FIG. 1a. Note that when $V_1 = V_2$, the output of the amplifier is at a voltage of 5 volts, equal to the voltage on one of the power supply rails. As shown in FIG. 1b, the active region of the amplifier lies in the region where the input voltage $V_1-V_2$ is the range from about −50 millivolts to zero where changes in the input voltage affect the output voltage. This active region will be referred to as the "normal operating range" of the amplifier for all amplifiers disclosed herein. Those of ordinary skill in the art will readily recognize that, depending on the particular offset voltages of the individual transistors, the transfer curve of FIG. 1b for any given amplifier could be shifted to either the right or the left on the X axis of FIG. 1b.

Those of ordinary skill in the art will also recognize that the circuit of FIG. 1 suffers from another drawback. That is, when the voltage $V_{out}$ is less than the voltage V, the transistor $Q_2$ will stop conducting and the output voltage will no longer be a function of the differential input voltage.

Figure 1C:
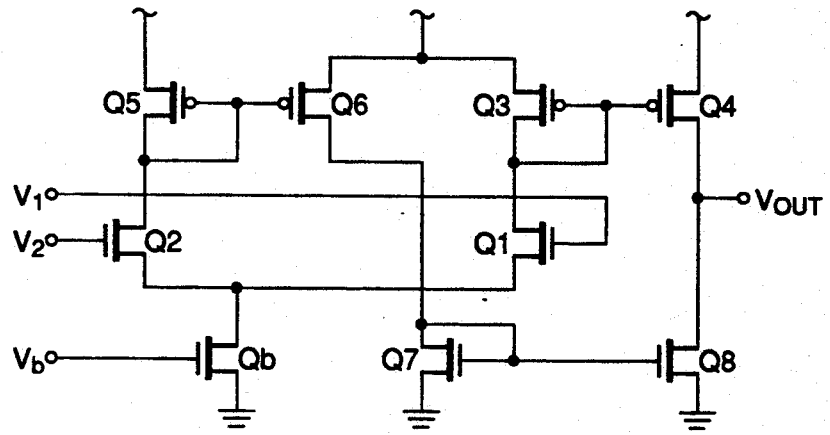

The circuit of FIG. 1c, also known in the prior art, is meant to overcome the second difficulty mentioned with respect to the circuit of FIG. 1a. In the circuit of FIG. 1c, the current mirror comprising $Q_3$ and $Q_4$ and the current mirror comprising $Q_5$ and $Q_6$ isolate the output stages from the input stages, thus allowing the output voltage to be free of the dependence on the input voltage exhibited by the circuit of FIG. 1a.

The circuit of FIG. 1c also suffers from the input offset voltage problem noted with respect to the circuit of FIG. 1a. This may be seen by examination of FIG. 1d, a typical transfer curve of the circuit shown in FIG. 1c. It will be observed that the linear portion of the transfer curve ($I_{out}$ vs $V_{in}$) is not symmetrical about the $V_1=V_2$ position on the curve. For any individual amplifier circuit, the transfer curve of FIG. 1d may be located at different positions along the X axis due to the random offset voltage inherent in each circuit as a result of its manufacture. Because of the input offset voltage, the amplifier has an output current when the input voltage difference is zero. Since these amplifiers are often used as differential amplifiers, where they are connected so as to utilize the output current as a measure of the input voltage difference, it is clear that the offset voltage prevents the amplifier from operating as intended.

Figure 1D:
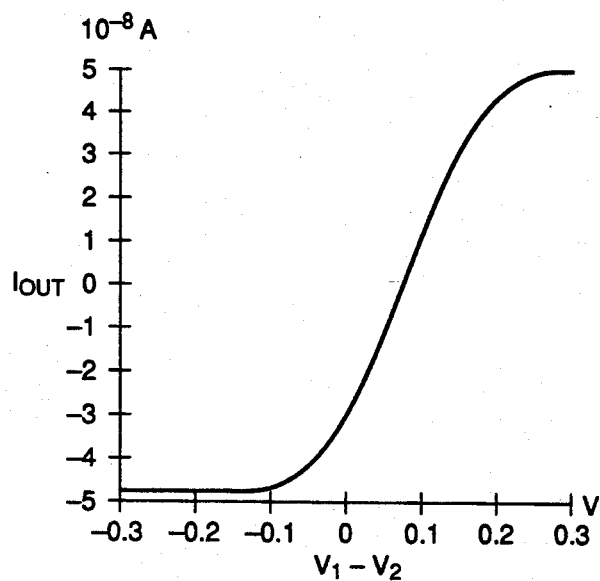

Those of ordinary skill in the art will note that a third drawback, common to the circuits of FIGS. 1a and FIG. 1c, is that the range of input voltages for which the output transfer function is approximately linear is very small. When used as a current output device, as shown in FIG. 1d, the range of output voltage for which the transfer function is approximately linear is restricted to a range of differential input voltage less than 200 millivolts. When used as a voltage output device, the range of operation is even smaller (FIG. 1b). This factor, coupled with the random input offset voltage exhibited by the circuits of FIG. 1a and 1c, severely restricts the applications to which such circuits may be put.

The present invention provides a solution to the input offset voltage problem and the limited input voltage range inherent in prior art transconductance amplifier circuits like those of FIGS. 1a and 1c.

Figure 2A:
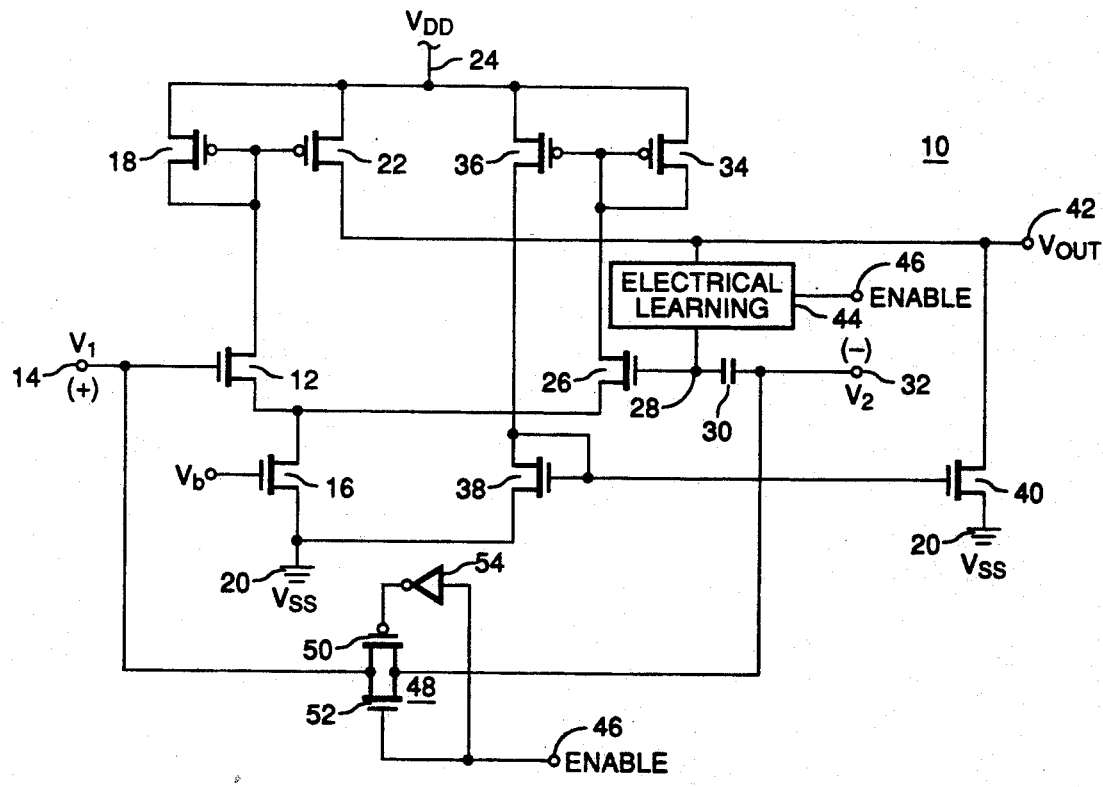
FIG. 2a is a schematic diagram of one embodiment of an adaptable amplifier according to the present invention.

Referring now to FIG. 2a, an illustrative amplifier 10 according to the present invention may be achieved by modification of the amplifier circuit of FIG. 1a. A first N-channel MOS input transistor 12 has its gate connected to a non-inverting input node 14, its source connected to the drain of an N-channel MOS bias transistor 16, and its drain connected to the drain and gate of a first P-channel current mirror transistor 18. The source of N-channel MOS bias transistor 16 is connected to a source of fixed negative voltage $V_{SS}$, shown as ground at reference numeral 20 in FIG. 2a, and its gate is connected to a source of bias voltage $V_b$. The drain and gate of first P-channel current mirror transistor 18 is also connected to the gate of second P-channel current mirror transistor 22. The sources of first and second P-channel current mirror transistors 18 and 22 are connected to a source of fixed positive voltage 24, shown as $V_{DD}$ in FIG. 2a.

A second N-channel MOS input transistor 26 has its gate connected to a floating node 28. A first capacitor 30 has as its first electrode floating node 28 and as its second electrode an inverting input node 32. The source of second N-channel MOS input transistor 26 is connected to the drain of N-channel MOS bias transistor 16, and the drain of second N-channel MOS input transistor 26 is connected to the gate and drain of a third P-channel MOS current mirror transistor 34. The source of third P-channel MOS current mirror transistor 34 is connected to voltage source 24. A fourth current mirror transistor 36 has its source connected to voltage source 24, its gate connected to the gate of third P-channel MOS current mirror transistor 34, and its drain connected to the gate and drain of first N-channel MOS current mirror transistor 38. The source of first N-channel MOS current mirror transistor 38 is connected to voltage source 20. A second N-channel MOS current mirror transistor 40 has its gate connected to the gate of first N-channel MOS current mirror transistor 38. The drain of second N-channel MOS current mirror transistor 40 is connected to an output node 42 and to the drain of second P-channel current mirror transistor 22.

Floating node 28 is preferably formed from a first polysilicon layer in a double polysilicon layer process and may be referred to as a floating gate. The electrodes of capacitor 30 are formed from floating gate 28 and from a second layer of polysilicon.

Electrical learning means, shown symbolically at reference numeral 44 is connected between floating node 28 and output node 42. It has an enable input 46. The preferred embodiment of learning means 44 will be disclosed herein with reference to FIGS. 3a–3g and 4a–4c.

Finally, a conventional pass gate 48 including a P-channel MOS transistor 50, an N-channel MOS transistor 52 and an inverter 54, connected to enable input 46 as shown in FIG. 2a, is connected between inverting input node 32 and non-inverting input node 14. The circuit of FIG. 2a may be schematically represented as shown in FIG. 2b, including amplifier symbol 60, electrical learning means 44, capacitor 30, and input nodes 14 and 32.

Figure 2B:
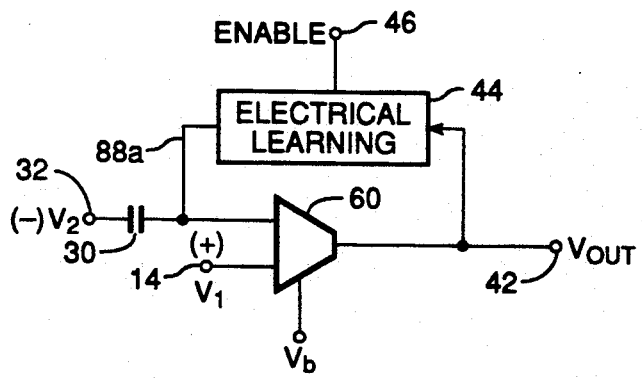
FIG. 2b is an equivalent schematic diagram of the circuit of FIG. 2a, showing the adaptable amplifier using a generic schematic symbol.

During normal circuit operation, when enable input 46 is low, the circuit of FIGS. 2a and 2b performs much like the circuit of FIG. 1a. A major difference between the circuit of FIGS. 2a and 2b and prior art amplifier circuits is the ability of the circuit of FIGS. 2a and 2b to be adapted in order to negate the effects of inherent offset voltages. This ability stems from additional structure within electrical learning means 44 associated with floating gate 28 and is nonvolatile. When enable input 46 is high, input nodes 14 and 32 are connected together by pass gate 48, and the electrical learning circuitry of the present invention is enabled. Unlike conventional floating gate devices known in the prior art, adaptation of the amplifier structures disclosed herein may take place while the amplifier is performing its normal in-circuit function, while the voltage on floating node 28 is within the normal operating range of the amplifier.

Presently preferred structures for performing the electrical learning function are disclosed and claimed in our co-pending application Ser. No. 363,678, filed Jun. 9, 1989, now U.S. Pat. No. 4,953,928, which is expressly incorporated herein by reference. These structures include both means for injecting electrons onto floating node 28 and means for extracting electrons from floating node 28.

It is presently preferred to inject electrons onto floating node 28 using a non-avalanche hot electron injection semiconductor device. Suitable semiconductor devices for performing non-avalanche hot electron injection are depicted in FIGS. 3a-3f.

Figure 3A:
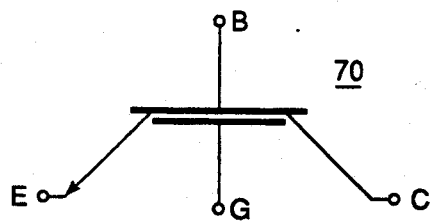
FIG. 3a is a generic schematic symbol for a non-avalanche hot electron injection device.

Referring first to FIG. 3a, a generic schematic symbol for such a non-avalanche hot electron injection device is shown at reference numeral 70 as an NPN bipolar transistor having an insulated gate member in addition to its base, emitter, and collector regions. In the structural implementations which follow as FIGS. 3b-3f, this NPN transistor is shown as both a lateral device and a vertical device. As an aid to interpretation of the following figures, like structures are given like reference numerals.

Figure 3B:
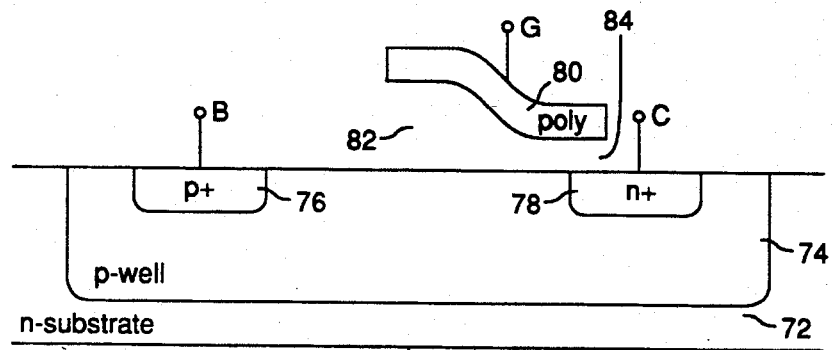

Referring to FIG. 3b, a first embodiment of the device of FIG. 3a may be fabricated on a semiconductor substrate 72 of a first conductivity type, which serves as the device emitter. A well region 74 of a second conductivity type, serving as the base of the device, is formed in substrate 72. A contact doped region 76 of the same conductivity type as the well region 74 serves as the base contact. A doped region 78 having a conductivity type opposite to that of well region 74 serves as the collector of the device.

A polysilicon floating gate 80 (which forms floating node 28 of the amplifiers disclosed herein) is formed above the surface of the well structure 74 and is separated from the surface of the well by an insulating layer 82. A portion of floating gate 80, lying at least partially above doped region 78, is separated from the surface of the well by an insulting layer 84, having a thickness less than the thickness of insulting layer 82.

Figure 3C:
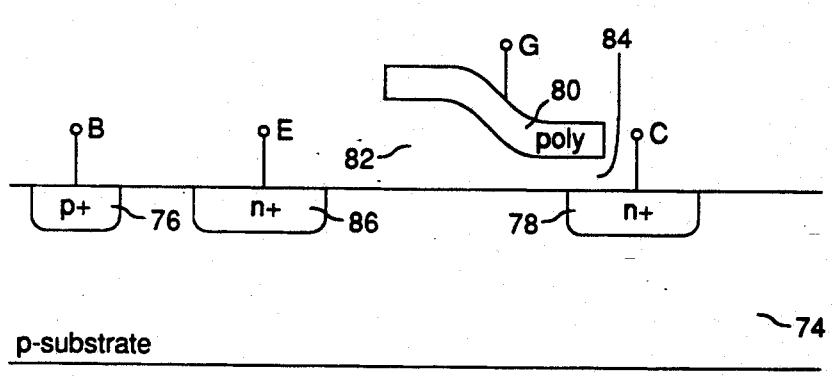

In an alternative embodiment shown in FIG. 3c, the well region may be eliminated if a substrate region 74 of second conductivity type is used which, like the well region 74 of FIG. 3b, serves as the base of the device, with doped region 76 used as the base contact. Doped region 78, of the first conductivity type, serves as the collector of the device. In this embodiment, another doped region 86 of the first conductivity type in substrate 74 serves as the emitter of the device.

Figure 3D:
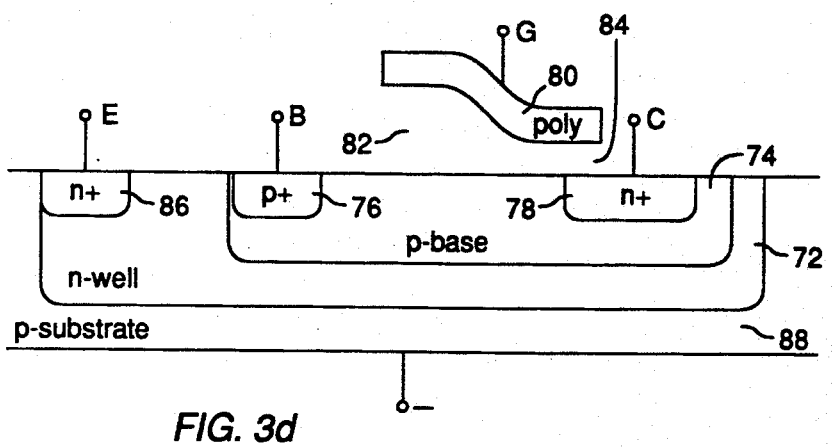

The embodiment shown in FIG. 3d is much like the embodiment of FIG. 3b except that region 72, the substrate in FIG. 3b, is a well region in a substrate 88 of the second conductivity type and a doped region 86 of the first conductivity type in well region 72 serves as the emitter contact of the device.

Figure 3E:
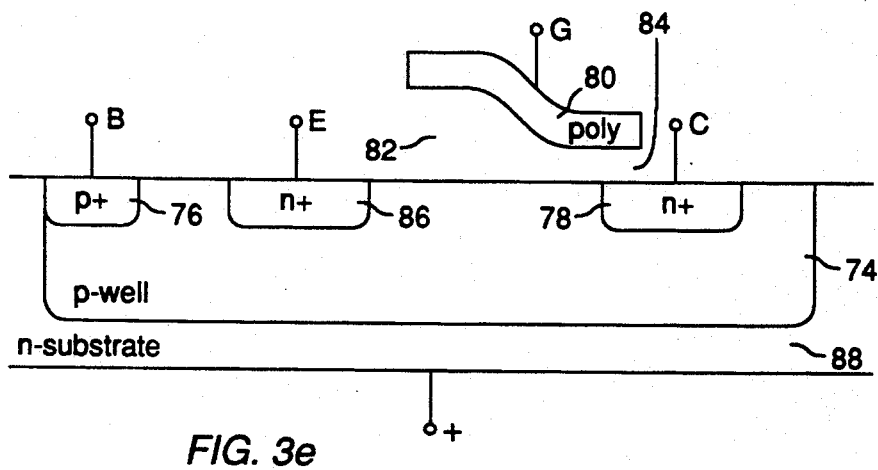

The embodiment of FIG. 3e is similar to the embodiment of FIG. 3b but the emitter of the device is a doped region 86 of the first conductivity type in the well region 74 instead of the substrate 88.

Figure 3F:
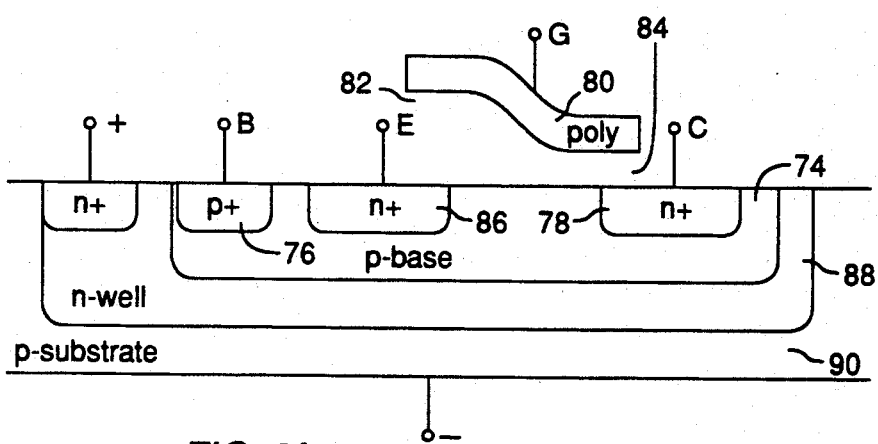

The embodiment of FIG. 3f is like the embodiment of FIG. 3e but the substrate 88 of FIG. 3e is a well 88 in a substrate 90 of the second conductivity type in FIG. 3f.

Figure 3G:
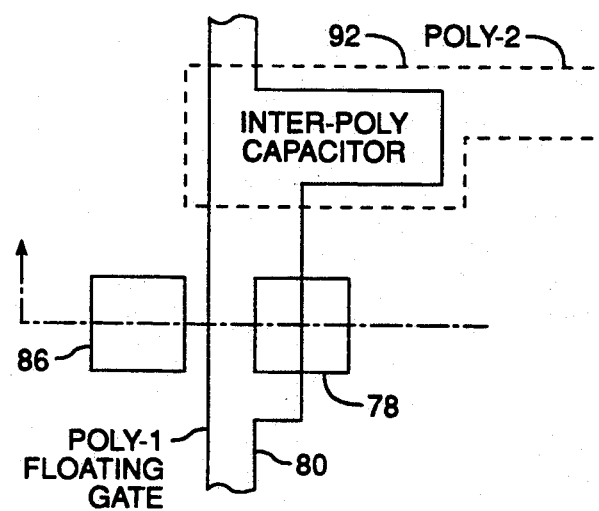
FIG. 3g is a top view of the central portions of structures of FIGS. 3b–3f, showing the positioning of a second polysilicon layer.

As may easily be seen from FIG. 3g, a region of second layer polysilicon 92 overlies a large portion of floating gate, is separated therefrom by a layer of interpoly oxide, and is thus capacitively coupled thereto. The second polysilicon layer 92 may be formed as a standard second electrode from second level polysilicon using conventional CMOS processing techniques. The second layer polysilicon region 92 is used to hold polysilicon floating gate 80 at a desired potential through capacitive coupling.

Typically, the well regions in the structures shown in FIGS. 3b-3f may be on the order of 3 microns in depth, doped to concentrations in the area of about $1 \times 10^{16}$ atoms/cm$^3$. The substrate regions may be doped to concentrations on the order of about $5 \times 10^{15}$ atoms/cm$^3$. The diffusion regions in the wells and substrates may be on the order of about 0.3 microns in depth, doped to a concentration of about $1 \times 10^{20}$ atoms/cm$^3$. The base regions in FIGS. 3d and 3f may be about 0.5 microns in depth, doped to a concentration of about $1 \times 10^{17}$ atoms/cm$^3$. The preferred dopant species is boron, although those of ordinary skill in the art will understand that other species may be used.

In the presently preferred embodiments of FIGS. 3b-3f, the gate oxide thicknesses should be about 400 angstroms and polysilicon gate layer thicknesses should be about 4,000 angstroms, and the polysilicon gates should be doped to a level of about $1 \times 10^{21}$ atoms/cm$^3$. The capacitive coupling of the polysilicon gate to the collector of these devices should be about 20 femtofarads.

Figure 3H:
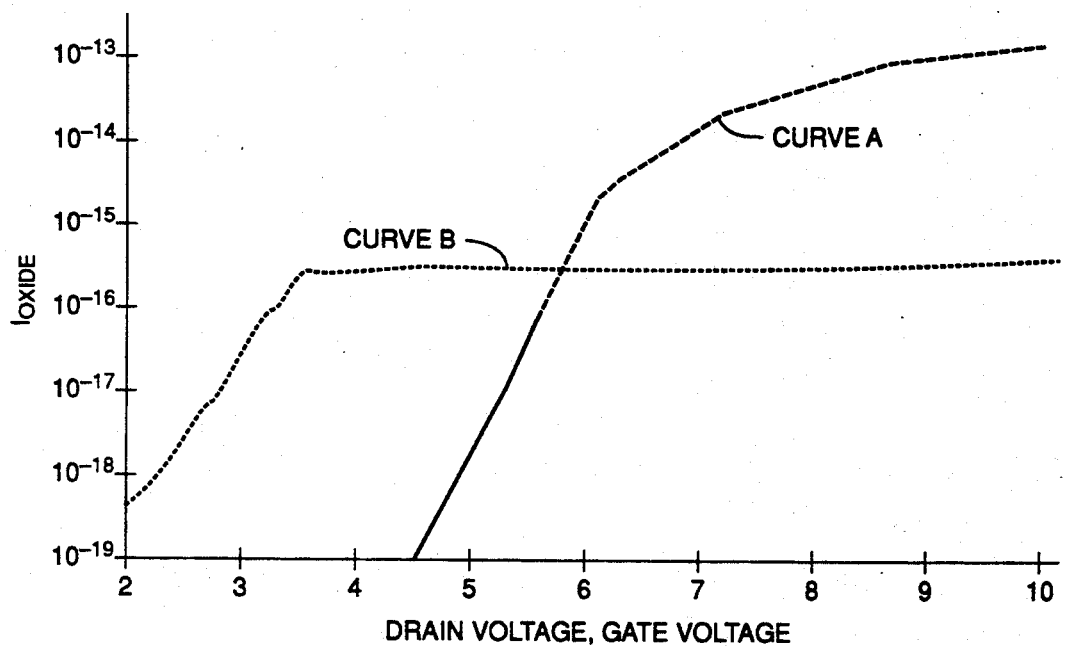
FIG. 3h is a graph in which curve A is a graph of current injected on to the floating node as a function of the voltage on the floating node and curve B is a graph of current injected on to the floating node as a function of collector voltage of the hot electron injection device measured with respect to its base at a device current level of 500 nanoamperes.

Curve A of FIG. 3h is a graph of current injected on to floating node 28 as a function of the voltage on floating node 28. Curve B is a graph of current injected on to floating node 28 as a function of collector voltage of hot electron injection device 70 measured with respect to its base at a device current of 500 nanoamperes. These curves were taken with an emitter current of approximately 500 nanoamperes. The rate of electron injection was found to be proportional to the emitter current over several orders of magnitude below this current level. Thus, either the emitter current or the collector voltage, or both, may be used as electrical inputs whereby the electron injection rate on to floating node 28 may be controlled over many orders of magnitude without significantly affecting the voltage on the floating node 28, provided that the capacitive coupling between the floating node 28 and the collector is significantly smaller than the capacitance of capacitor 30. The ratio of these capacitances is preferably greater than 10:1.

Figure 4A:
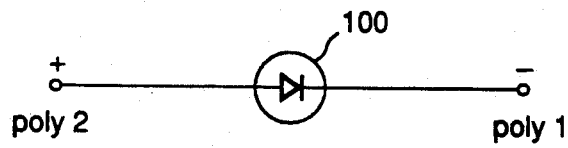
FIG. 4a is a generic schematic symbol for an interpoly tunneling device.

In a presently preferred embodiment of the invention, the means for removing electrons from the floating node 28 of the amplifiers disclosed herein is an interpoly tunneling device. Referring to FIG. 4a a generic schematic symbol 100 for such a device is shown.

Figure 4B:
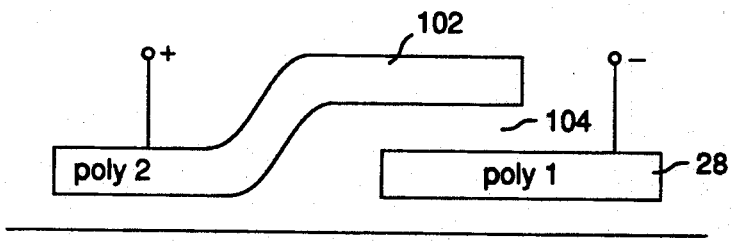
FIG. 4b is a cross sectional view of a presently preferred interpoly tunneling device.

Referring to FIG. 4b, this interpoly tunneling device is shown to preferably include a second layer of polysilicon 102, which may have a thickness of about 4,000 angstroms and an arsenic or phosphorus doping concentration of about $1 \times 10^{21}$, disposed above a selected portion of floating node 28 and separated therefrom by an insulting layer 104 having a thickness on the order of from about 500 to 700 angstroms. The capacitance between second polysilicon layer 102 and floating node 28 should be kept as small as allowed by the design rules of the fabrication process.

By varying the voltage on second layer of polysilicon 102, the rate of electron removal from floating node 28 can be controlled from zero (no tunneling) at zero volts, to $10^{-12}$ amperes at 11 volts, these voltages being measured relative to floating node 28. Thus the voltage on second layer polysilicon 102 may be used as an electrical input whereby the rate of electron removal from floating node 28 may be controlled over many orders of magnitude without significantly affecting the voltage on floating node 28, provided that the capacitive coupling between the floating node 28 and the second polysilicon layer 102 is significantly smaller than the capacitance of capacitor 30. The ratio of these capacitances is preferably greater than 10:1.

Figure 4C:
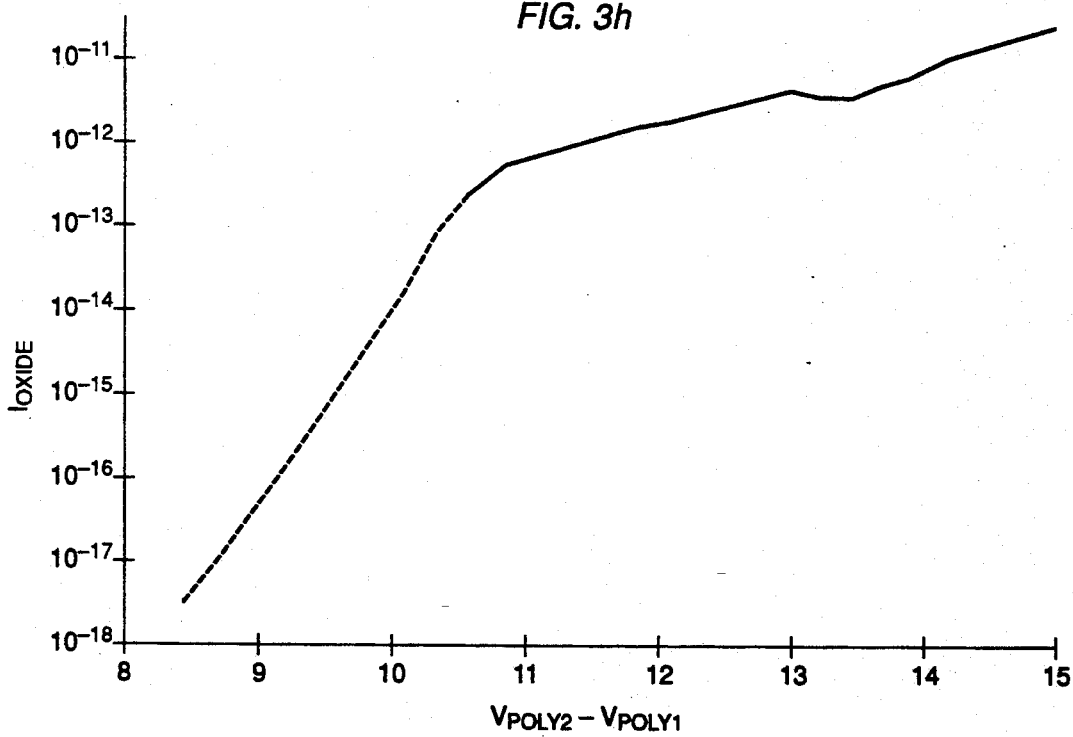
FIG. 4c is a graph of interpoly tunneling current versus interpoly voltage for the tunneling device of FIGS. 4a and 4b.

Referring now to FIG. 4c, a graph showing interpoly tunneling current as a function of interpoly voltage actually measured in a device fabricated according to the present invention, it can be seen that the tunneling rate can be controlled over orders of magnitude. For voltages less than 8 volts, the rates were so small that measurements would have taken many hours, however it has been established that the exponential dependence of the tunneling current as a function of interpoly voltage continues to exponentially smaller values of the current. Therefore, by applying interpoly voltages of less than 2 volts, it is possible to effectively disable the tunneling process and therefore leave the injected charge on the floating node 28 stable over a period of many years.

If it is assumed that learning means 44 includes a tunneling device 100 connected between output node 42 and floating node 28 and a hot electron injection device 70, connected to output node 42 and to one or more voltage sources as shown in FIGS. 3a-3f, it can be seen that the operation of the circuit of FIGS. 2a and 2b depends on the state of the active low adapt input node 46 and the voltage on floating node 28. If node 46 is high, the learning function is disabled and the amplifier operates with its crossover point determined by whatever voltage is on floating node 28.

If, however, node 46 is low, electrons will be caused to enter or leave floating node 28, depending on the state of the voltage on that node. If the voltage on floating node 28, reflected by the input voltage $V_{in}$, is high, the voltage at the first end of the tunneling device 100 will drop to a value below the voltage at which tunneling will take place. In addition, hot electron injection device 70 will cause hot electrons to be injected onto floating node 28. If the voltage on floating node 28, reflected by the input voltage $V_{in}$, is low, hot electron injection device 70 will be turned off.

The auto-compensating amplifiers of the present invention are characterized by the ability to accomplish two-way learning of an analog value onto the floating node. As used herein, "two-way" learning, is the ability to both inject and remove electrons from floating node 28 in a continuous manner while the amplifier continues to operate normally, and the device is performing its in-circuit function and the voltage on the floating node is within the normal operating range of the device.

Figure 5A:
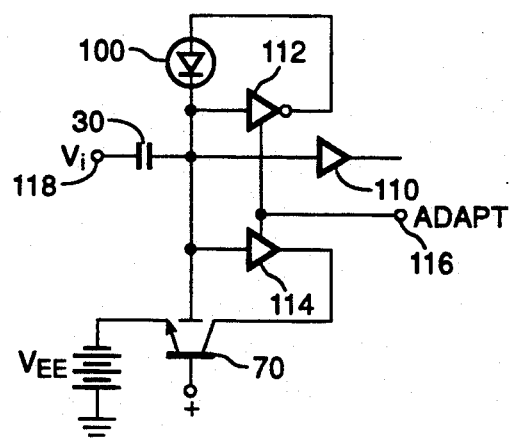
FIGS. 5a–5f are schematic diagrams of several alternative circuits for auto-compensating amplifiers according to the present invention.
Figure 5B:
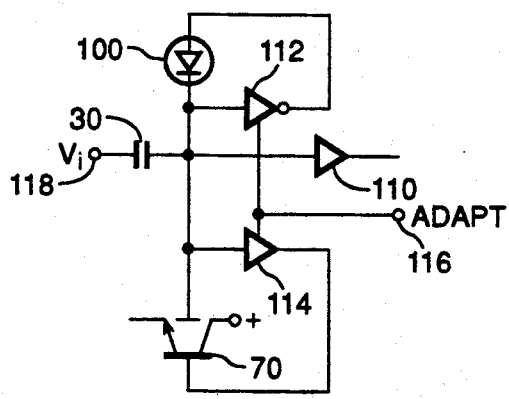
Figure 5C:
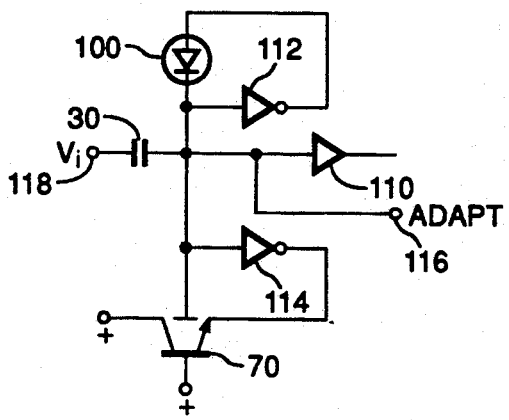

Several alternative circuits for auto-compensating amplifiers according to the present invention are shown in FIGS. 5a-c. Referring first to FIG. 5a, amplifier 110 has its input connected to floating node 28. Also connected to floating node 28 are the inputs of enabled inverting amplifier 112 and enabled non-inverting amplifier 114. The enable inputs of amplifiers 112 and 114 are connected to an adapt input 116. The circuit input node 118 is capacitively coupled to floating node 28 via capacitor 30.

The output of enabled inverting amplifier 112 is connected to the poly 2 end of interpoly tunneling device 100. The other end of interpoly tunneling device 100 is floating node 28.

The output of enabled non-inverting amplifier 114 is connected to the collector of hot electron injection device 70. The emitter of hot electron injection device 70 is connected to a voltage $V_{EE}$ as shown in FIG. 5a by the battery symbol, its base is connected to a source of positive voltage, and its gate is floating node 28.

It should be noted that the capacitance between floating node 28 and the collector of non-avalanche hot-electron injection device 70 acts as positive feedback in the circuit, and can introduce hysteresis that will limit the accuracy with which the auto-compensation can be accomplished. For this reason, it is desirable under most circumstances to limit the effective gain around the loop from floating node 28, through amplifier 114, through the capacitance $C_c$ between the collector of hot-electron injection device 70 and floating node 28. The magnitude of this loop gain is approximately the amplifier gain A multiplied by the ratio of $C_c$ to the total-capacitance $C_{TDT}$ of node 28 to all other nodes, including the input. If we denote the gain of amplifier 114 by A, then the criterion $$A \times \frac{C_c}{C_{TDT}} < 1$$

assures the absence of Hysteresic behavior, and allows the floating node to operate in the normal operating range of amplifier 114 during adaptation.

When adapt input 116 is disabled, amplifiers 112 and 114 are disabled and amplifier 110 operates to amplify the voltage present at input node 118. When adapt input 116 is enabled, amplifiers 112 and 114 are enabled and the voltage on floating node 28 is adapted to the voltage required to cancel any offsets. During adaptation, amplifier 110 continues to perform its amplifying function, i.e., it does not have to be placed in a special non-functioning state to be adapted. If the floating node voltage as coupled by input voltage $V_{in}$ is low such that the output voltage of inverting enabled amplifier 112 is high, the tunneling device 100 is enabled and increases the voltage on the floating node 28. If the floating node voltage as coupled by input voltage $V_{in}$ is high such that the output voltage of non-inverting enabled amplifier 114 is high, the hot electron injection device 70 is enabled and decreases the voltage on the floating node 28.

The embodiments of FIGS. 5b and 5c are similar to the embodiment of FIG. 5a and differ in the manner in which the hot electron injection device 70 is connected to the circuit. Whereas in FIG. 5a adaptation by the hot electron injection device is controlled by collector voltage, in FIGS. 5b and 5c adaptation is controlled by emitter current. In FIG. 5b, the output of non-inverting enabled amplifier 114 is connected to the base of hot electron injection device 70 and the collector of hot electron injection device 70 is connected to a source of positive voltage. In FIG. 5c, the output of a second inverting enabled amplifier 114 has its output connected to the emitter of hot electron injection device 70 and the collector and base of hot electron injection device 70 are both connected to sources of positive voltage. Varying these voltages will affect the injection rate.

Figure 5D:
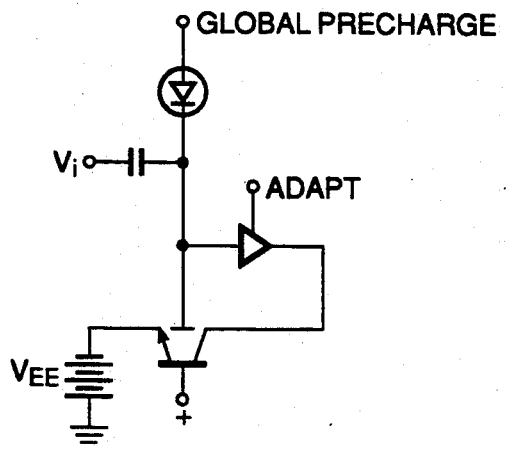
Figure 5E:
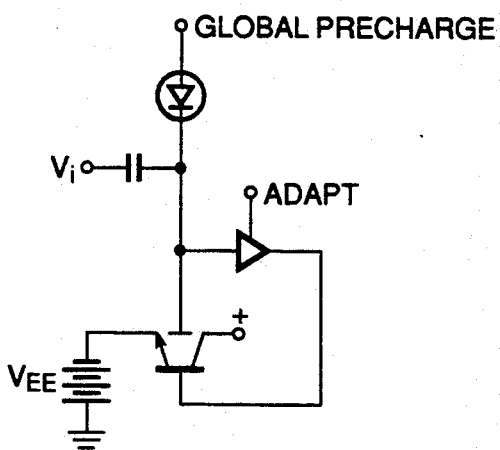
Figure 5F:
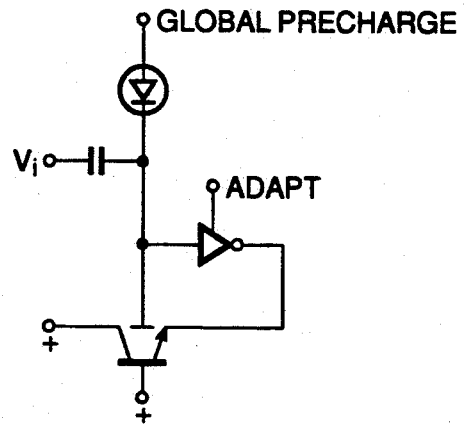

As an alternative to the arrangement of FIGS. 5a-5c, amplifier 112 may be eliminated and the first end of tunneling device 100 may be connected to a node which can be used as an precharge node by the application of a positive voltage, as shown in FIGS. 5d-5f.

Many amplifiers on a single integrated circuit can be precharged by raising the precharge input to a voltage at which tunneling takes place. After some time, the offset voltages of all amplifiers will be of the same sign, and the precharge input voltage can be reduced to a value at which the tunneling current is negligible. The hot-electron injection devices in each individual amplifier can then adapt each amplifier until its individual offset is compensated by the hot-electron injection structure associated with that amplifier. After compensation has taken place hot-electron injection is reduced to a negligible level by the negative feedback control of hot electron injection through amplifier 114, exactly as is the case of FIGS. 5a-5c.

Figure 6:
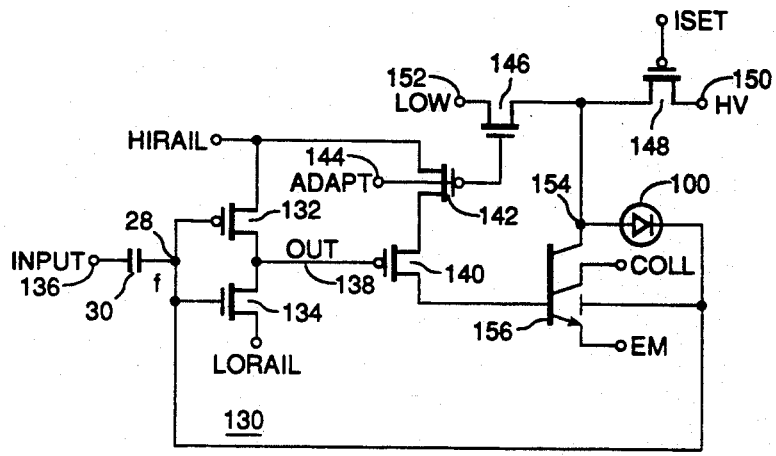
FIG. 6 is a schematic diagram of an auto-compensating amplifier according to one aspect of the present invention configured as an inverter.

Referring now to FIG. 6, a schematic diagram of a presently preferred embodiment of the circuit of FIG. 5b, utilizing a simple inverter as amplifier 110. A circuit structure is shown which is useful for performing the long term analog learning function. While amplifier 130 is shown in FIG. 6 as a simple inverter, those of ordinary skill in the art will recognize that other amplifiers, such as the type of amplifier disclosed with reference to FIGS. 2a and 2b, may be utilized.

As shown in FIG. 6, amplifier 130 is configured as a CMOS inverter including P-Channel MOS transistor 132 and N-Channel MOS transistor 134 connected in series between the power supply rails. The input node of amplifier 130 is a floating node 28, coupled to the circuit input 136 node via capacitor 30.

The output node 138 of amplifier 130 is connected to the gate of P-channel MOS transistor 140. The source of P-Channel MOS transistor 140 is connected to the drain of P-Channel MOS transistor 142, whose source is connected to the positive voltage rail and whose gate is connected to a low-active adapt signal node 144. Low active adapt signal node 144 is also connected to the gate of an N-Channel MOS transistor 146. N-channel MOS transistor 146 is connected in series with P-Channel MOS transistor 148 between a source of high positive voltage 150 and a source of low voltage 152. The first end of tunneling device 100 at node 154 is connected to the common connection of the drains of transistors 146 and 148, and the other end is floating node 28. Source of high positive voltage 150 should be at a voltage high enough to cause tunneling to take place in tunneling device 100, and source of low voltage 152 may be ground or any voltage at which tunneling in tunneling device 100 may take place at an acceptably slow rate. The gate of P-channel MOS transistor 148 is connected to a voltage node $I_{set}$ which will cause a trickle current, i.e., less than about 0.5 microamperes, to flow through P-channel MOS transistor 148.

The drain of P-Channel MOS transistor 140 is connected to the base of hot electron injection device 156, which, in this embodiment includes a double collector NPN bipolar transistor with an insulated MOS polysilicon gate which is electrically connected to floating node 28. One of the collectors of hot electron injection device 156 is connected to the common connection of the drains of transistors 146 and 148. Its other collector is used as an enable input and its emitter is connected to a source of bias voltage.

Figure 7A:
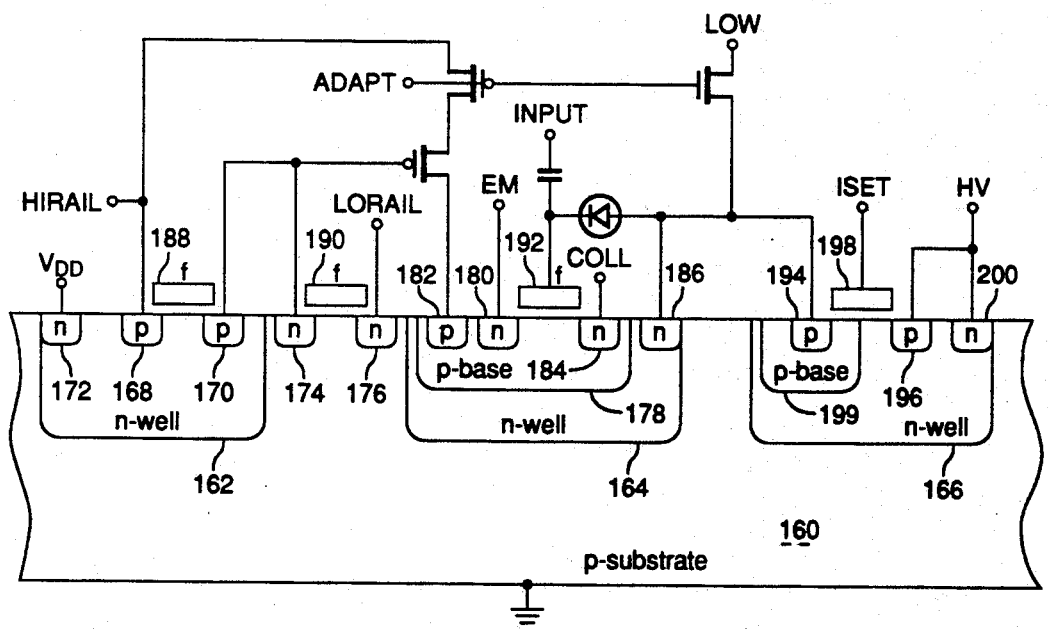
FIGS. 7a and 7b are, respectively semiconductor cross sectional and top views of a presently preferred layout of the circuit of FIG. 6.
Figure 7B:
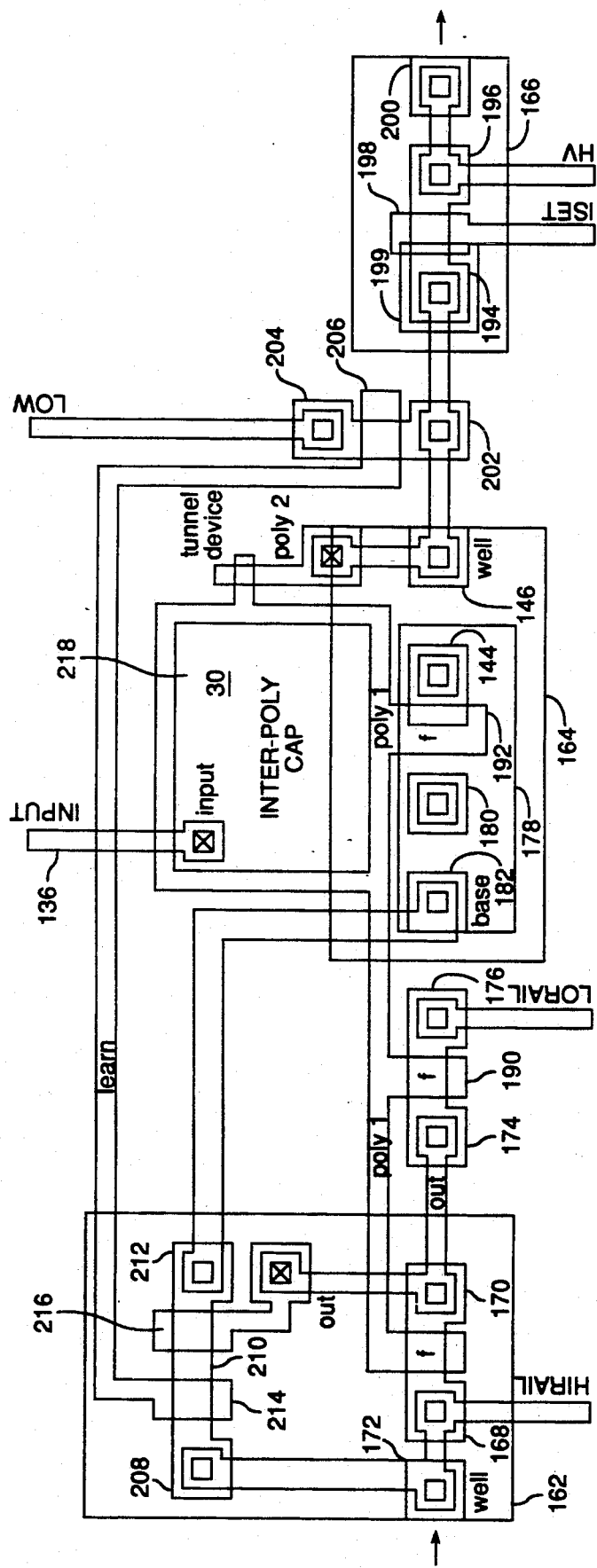

FIGS. 7a and 7b are, respectively, a cross sectional view and a top view of a presently preferred layout for the circuit depicted in FIG. 6. Referring first to FIG. 7a, the circuit of FIG. 6 may be fabricated on p-type substrate 160 in which n-wells 162, 164, and 166 are conventionally formed. P-channel MOS transistor 132 is formed in n-well 162, and has doped p-type regions 168 and 170, which act as its source and drain respectively. N-type doped region 172, the contact to the n-well 162, is connected to a source of positive voltage, which may be $V_{DD}$ or a higher voltage to produce a body effect in P-channel MOS transistor 132 to alter the shape of its current output characteristic as is known in the art.

N-type doped regions 174 and 176 form the drain and source, respectively, of N-channel transistor 134. Hot electron injection device 156 is formed inside n-well 164, which serves as the first collector of the device. P-type base region 178 contains n-type region 180, serving as the emitter of the device, p-type region 182, serving as the base contact of the device, and n-type region 184, serving as the second collector of the device. N-type region 186 serves as the contact for the first collector.

The gates of transistors 132, 134, shown at reference numerals 188 and 190, and the gate of hot electron injection device 156, shown at reference numeral 192 are fabricated from the layer of polysilicon which comprises floating node 28.

P-channel MOS transistor 148 is constructed in n-well 166, in which p-type doped regions 194 and 196, respectively, serve as its drain and source, and polysilicon region 198 serves as its gate. P-type region 194 is placed inside lightly doped drain region 199. N-type region 200 is used to connect the source of high voltage to the source of MOS transistor 148.

Referring now to FIG. 7b, a top view of the structure of the semiconductor cross section of FIG. 7a, p-type regions 202 and 204 serve as the drain and source, respectively, of N-channel MOS transistor 146, and polysilicon region 206 serves as its gate. P-type, regions 208 and 210 serve as the source and drain of P-channel transistor 142, P-type regions 210 and 212 serve as the source and drain of p-channel MOS transistor 140, and polysilicon regions 214 and 216, respectively, serve as their gates.

Input node 136 is connected to polysilicon layer 218 which serves as the input plate of capacitor 30. Floating node 28 forms the other plate of capacitor 30.

The operation of the circuit of FIG. 6 depends on the state of the active low learn input node 144 and the voltage on floating node 28. If node 144 is high, P-channel transistors 140 and 142 are turned off, and N-channel transistor 146 is turned on, thus disabling the learning function, and the inverter comprising transistors 132 and 134 operates with its crossover point determined by whatever voltage is on floating node 28.

If, however, node 144 is low, electrons will be caused to enter or leave floating node 28, depending on the state of the voltage on that node. If the voltage on floating node 28, reflecting the input voltage $V_{in}$, is high, such that the inverter output node 138 is low, P-channel transistors 140 and 142 will both be turned on, causing base current to flow in hot electron injection device 156. The collector current through hot electron injection device 156 will drop the voltage at node 144, the first end of the tunneling device 100 to a value below the voltage at which appreciable tunneling will take place. In addition, hot electron injection device 156 will Cause hot electrons to be injected onto floating node 28. If the voltage on floating node 28, reflected by the input voltage $V_{in}$, is low, such that the inverter amplifier output is high, P-channel transistors 140 and 142 will both be turned off, turning off hot electron injection device 154. The voltage at node 156, the first end of the tunneling device 100 will be established at a value above the voltage at which tunneling will take place causing electrons to leave floating node 28.

Because the voltage on tunneling node 154 ranges from highly positive (10 volts) to near zero relative to floating node voltage, the reverse bias voltages encountered by the drains of MOS transistors 146 and 148 are generally beyond those at which a simple MOS transistor can operate. For this reason, these transistors should be constructed in such a manner that they can be operated with high drain voltages without adverse consequences. The exact techniques employed to construct high voltage MOS transistors will depend on the details of the process employed, and are well known to those of ordinary skill in the art. In most processes, the breakdown voltage of the other collector 164 of the hot electron injection device will be much higher than required.

In FIGS. 7a and 7b, the high voltage capability is achieved in transistor 148 by using a lightly doped drain region, which may be formed during the p-base diffusion step as is well known in the art. A similar technique is used with transistor 146, by forming a lightly doped drain during the n-well diffusion step.

For the purposes of FIGS. 7a and 7b, those of ordinary skill in the art will realize that, if the amplifier of FIG. 2a, rather than the amplifier of FIG. 6 is being used as the amplifier 110 of FIG. 5a, its output node 42 will be equivalent to output node 138 of the circuit of FIG. 6.

Figure 8:
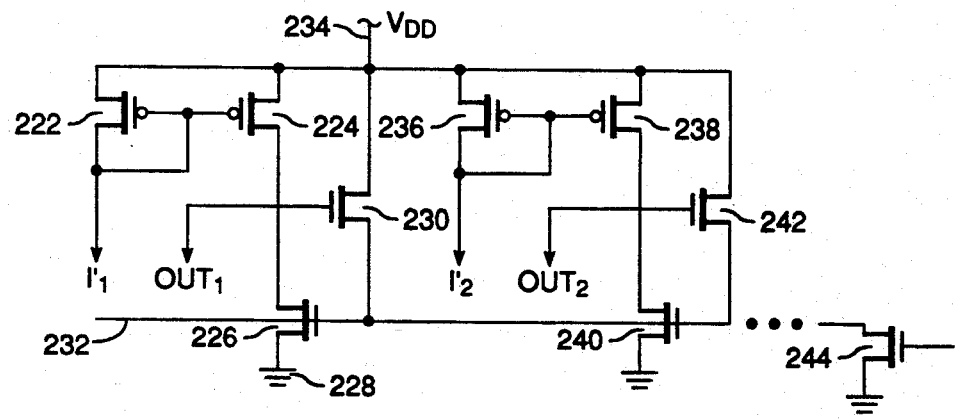
FIG. 8 is a schematic diagram of a generally useful circuit known as a "winner-take-all" circuit.

Referring now to FIG. 8, a generally useful circuit known as a "winner-take-all" circuit is shown. The operation of this circuit is completely disclosed in co-pending application Ser. No. 277,795, filed Nov. 30, 1988, which is expressly incorporated herein by reference.

In FIG. 8, winner-take-all circuit 220 includes a plurality of sections, two of which are shown. In the first section, a current mirror consisting of P-channel current mirror MOS transistor 222 and P-channel MOS current mirror transistor 224. The drain of p-channel current mirror transistor 224 is connected to the drain of N-channel MOS transistor 226. The source of N-channel MOS transistor 226 is connected to a source of negative voltage, shown as reference numeral 228 in FIG. 8 as $V_{SS}$ or ground.

Another N-channel MOS follower transistor 230 has its source connected to a common gate line 232, its drain connected to a source of positive voltage $V_{DD}$, shown at reference numeral 234 and its gate connected to the common connection of the drain of N-channel MOS transistor 226 and the drain of P-channel MOS current mirror transistor 224. The node to which the gate of N-channel MOS transistor 230 is connected is the output current node for the column of the array of FIG. 8 associated with that section shown in FIG. 8 as $OUT_1$.

The second section of the circuit for the second column includes a current mirror comprising P-channel MOS current mirror transistors 236 and 238 and N-channel MOS transistors 240 and 242, connected in exactly the same manner as are the transistors for the first section. Common gate line 232 is connected to the drain of N-channel MOS transistor 244, whose purpose is to provide a bias current out of common gate line 232.

While the operation of the winner-take-all circuit in FIG. 8 is fully described in co-pending application Ser. No. 277,795 incorporated herein by reference, briefly, follower transistors 230, 242, etc., pull the common gate line 232 up to a voltage at which the saturation current through the common gate pulldown devices 226, 240, etc., is equal to the input current of the winning input. This turns off all sections in the circuit except for the one having the largest current flowing into it.

The circuit of FIG. 8 is very effective in identifying the largest of a number of currents as long as the corresponding transistors in each section are well matched. However, the inevitable mismatches which occur between nominally identical transistors as realized in silicon can cause one section to win even when some other section has higher input current. For this reason, it is desirable to apply the teachings of the present invention to adapt the winner-take-all circuit such that all sections will win equally (tie) when all input currents are equal, and no particular section will be favored due to transistor mismatch.

Figure 9:
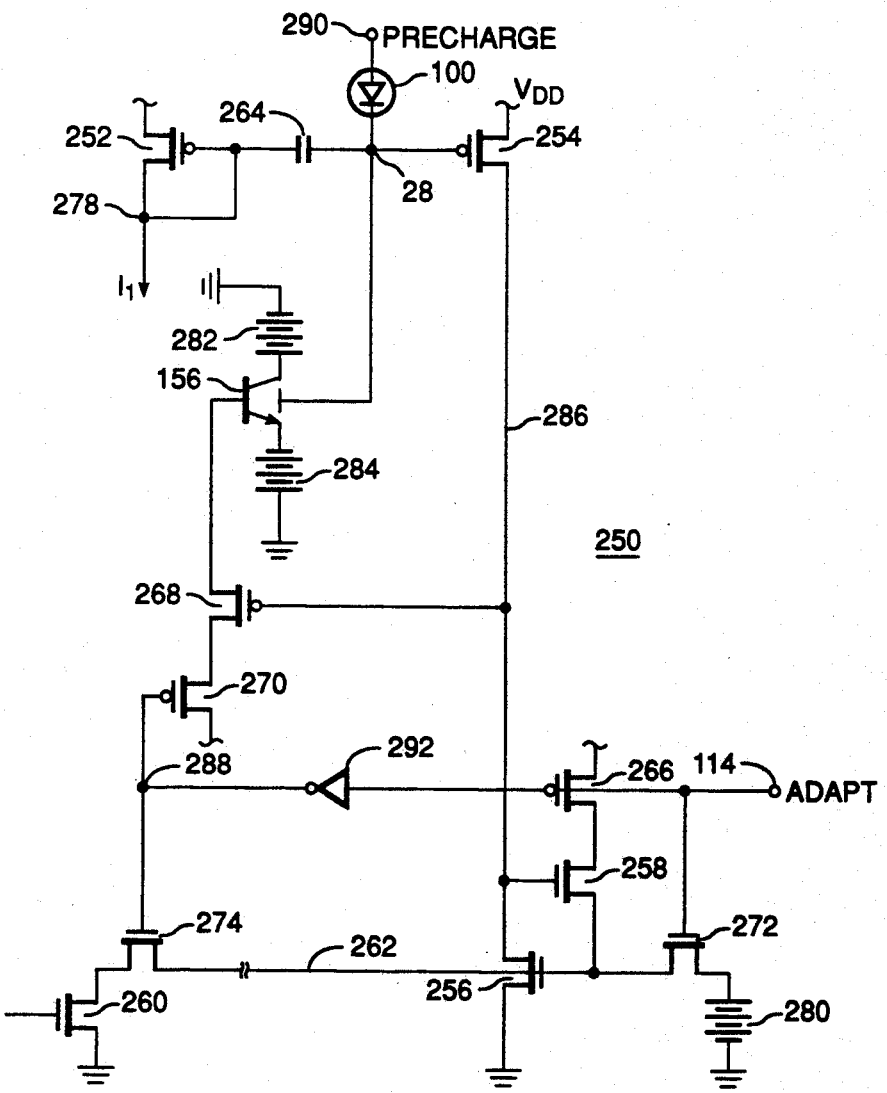
FIG. 9 is a schematic diagram of one section of an adaptive winner-take-all circuit such as the one shown in FIG. 8.

One section of an adaptive winner-take-all circuit such as the one shown in FIG. 8 is shown in FIG. 9. In this adaptive winner-take-all circuit 250, P-channel transistor 252 corresponds to P-channel transistor 222 in FIG. 8, P-channel transistor 254 corresponds to P-channel transistor 224 in FIG. 8, N-channel transistor 256 corresponds to N-channel transistor 226 in FIG. 8, N-channel transistor 258 corresponds to N-channel transistor 230 in FIG. 8, N-channel transistor 260 corresponds to N-channel transistor 244 in FIG. 8, and common gate line 262 corresponds to common gate line 232 in FIG. 8.

In addition, capacitor 264 connects the gate of P-channel current mirror transistor 252 to the gate of P-channel current mirror transistor 254, and transistors 266, 268, 270, 272, and 274 are used to reconfigure the circuit during adaptation.

The adaptation portion of the circuit includes hot electron injection device 156, having its gate connected to floating node 28, its collector connected to a source of positive voltage as indicated symbolically by battery symbol 282, and its emitter connected to a source of negative voltage as indicated by battery symbol 284. In addition, the base of hot electron injection device 156 is connected to the drain of P-channel MOS transistor 268. The source of P-channel MOS transistor 268 is connected to the drain of P-channel MOS transistor 270 and its gate is connected to node 286, the output node (the drain) of follower transistor 256. The source of P-channel MOS transistor 270 is connected to a source of positive voltage $V_{DD}$ and its gate is connected to low active adapt node 288. Finally, a tunneling device 100 is connected to floating node 28. In order to provide for a global precharge function for all legs of the "winner take all circuit, the ends of the tunneling devices in each leg remote from a floating node 28 are all connected together to a common precharge node 290 connectable to a high voltage source (having a voltage high enough to permit electron tunneling from floating node 28) in order that all floating nodes may be precharged simultaneously by connecting the high voltage source to the precharge node.

The operation of the circuit of FIG. 9 can be understood as follows: when the adapt signal (line 114) is held low, the circuit is configured to be essentially identical to that of FIG. 8. Floating node 28 is coupled to the input node 278 by capacitor 264. When the adapt signal is low, the voltage on floating node 28 will follow the voltage on input node 278 quite closely. Hence the operation of the circuit is identical to that described above.

To adapt the circuit, the circuits generating input currents to all stages of the winner-take-all circuit are arranged to be in an equivalent state, that is a state that should be considered to be a tie by the winner-take-all circuit. The adapt signal on line 114 is raised to $V_{DD}$. With adapt signal on line 274 high, the signal on node 288 is held low by the action of inverter 292 and the winner-take-all common gate line 262 is held at a preset voltage noted symbolically by battery 280, by the action of N-channel MOS transistor 272, which is turned on, and P-channel MOS transistor 266, which is turned off. Bias transistor 260 is disconnected from the winner-take-all common gate line 262 by the action of N-channel MOS transistor 274, which is turned off.

In addition, P-channel MOS transistor 270 is turned on, allowing current to flow into the base of injection device 156. Hot electrons will be injected onto floating gate node 28, causing P-channel MOS transistor 254 to source more current. This injection will continue until the voltage at node 286 has risen sufficiently to turn off P-channel transistor 268, turning off the injection, i.e. adaptation will continue until floating node 28 is at a voltage to cause the current sourced by transistor 254 to equal the current set by transistor 256 and voltage source 280.

Figure 10:
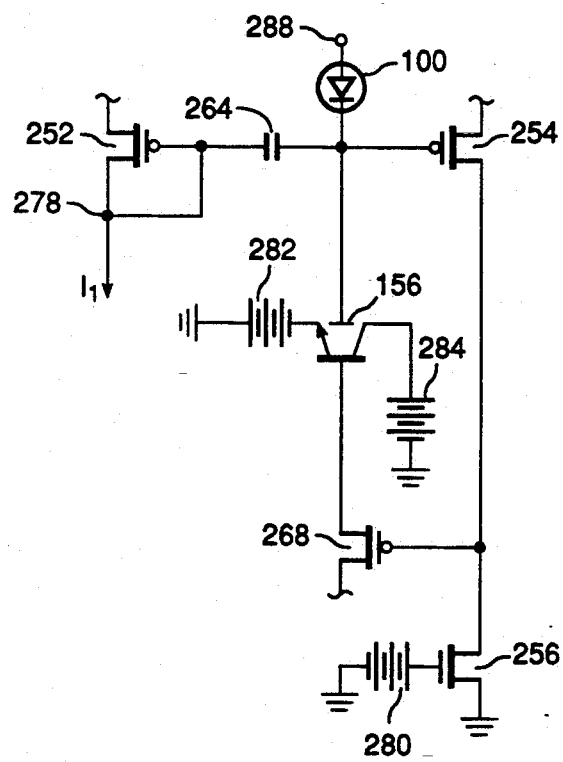
FIG. 10 is an equivalent schematic diagram of the circuit of FIG. 9 during adaptation.

During adaptation, those of ordinary skill in the art will appreciate that the circuit of FIG. 10 is the equivalent circuit of the circuit shown in FIG. 9. Those of ordinary skill in the art will appreciate the circuit of FIG. 10 to be an inverting amplifier with capacitor 264 in series with its inverting input, in accord with the teachings of the present invention. It follows that all outputs will be adapted to very nearly the same voltage. After the adaptation is complete, the adapt control signal line 144 is brought low. Thereafter the circuit will function as the circuit of FIG. 8, in which the effects of all offsets, including those of the circuits generating the input currents, are compensated.

It will be appreciated by those of ordinary skill in the art that the adaptation of the winner-take-all circuit is a special case of a generally useful method, which can be appreciated with reference to FIG. 10. During adaptation, the gate of transistor 256 is connected to a source of bias voltage, and the function of transistor 256 is to supply the output current desired from the current mirror when the particular "calibration" input current is present. If the current mirror transistors are operated in their sub-threshold range, where their drain currents are an exponential function of their gate voltages, the effect of adaptation is to fix the ratio of output current to input current at a particular desired value. After adaptation, the source of desired current can be removed and the current mirror can be used for any desired purpose, of which the winner-take-all function is one particularly useful example.

Note that the techniques of the present invention can be used to adapt amplifiers and current mirrors into a known state in the presence of any input voltage, and thus the amplifier can be used as a way to remember whatever input is present during adaptation. The technique therefore not only adapts out any offset of the amplifier and circuitry during it, but also retains a permanent memory of whatever input was present during adaptation. This analog memory capability is achieved at the same time, and with the same apparatus, as that used for simple offset compensation.

While presently-preferred embodiments of the present invention have been disclosed herein, those of ordinary skill in the art will be enabled, from the within disclosure, to configure embodiments which although not expressly disclosed herein nevertheless fall within the scope of the present invention. It is therefore, the intent of the inventors that the scope of the present invention be limited only by the appended claims.

What is claimed is:

1. An adaptable MOS current mirror fabricated on a semiconductor substrate, said adaptable MOS current mirror having an input node and an output node and including:
    first and second MOS transistors, each having a source, a gate, and a drain;
    a first MOS capacitor having first and second electrodes;
    the source of said first MOS transistor being connected to a source of fixed voltage, the gate and drain of said first MOS transistor being connected to said input node and to said first electrode of said first MOS capacitor, the source of said second MOS transistor being connected to a source of fixed voltage, the gate of said MOS transistor comprising a floating node connected to said second electrode of said first capacitor, the drain of said second MOS transistor forming said output node;
    means for generating a first electrical control signal;
    electron removal means coupled to said floating node and responsive to said means for generating said first electrical control signal, for removing electrons from said floating node, said electron removal means operating to vary the rate of removal of electrons from said floating gate in response to the magnitude of said first electrical control signal;
    means for selectively supplying a calibration current to said input node during adaptation;
    means for generating a second electrical control signal during adaptation;
    electron injecting means coupled to said floating node and responsive to said second electrical control signal for injecting electrons on to said floating node, said electron injecting means operating to vary the rate of injection of electrons on to said floating node in response to the magnitude of said second electrical control signal;
    whereby the output current of said current mirror is adapted to be equal to said desired output current when its input current is equal to said calibration current.

2. The adaptable MOS current mirror of claim 1 wherein said electron injecting means is a non-avalanche hot electron injection device including:
    a p-type region in said semiconductor substrate,
    an n-type region disposed in said p-type region,
    a floating gate disposed above said p-type region, said floating gate at least partially overlapping one edge of said n-type region and separated from the surface of said substrate by a gate oxide under a portion of said floating gate including at least where it partially overlaps the edge of said n-type region,
    means for applying a negative potential to said p-region, said negative potential having a magnitude of greater than about 3.2 volts relative to said floating gate,
    means for applying a positive potential to said n-type region with respect to said p-type region to reverse bias said n-type region, said positive potential having a magnitude greater than about 3.2 volts relative to said p-type region, but less than the voltage required to induce avalanche breakdown between said n-type region and said p-type region, means for injecting electrons into said p-type region, whereby said first and second positive potentials act to accelerate said electrons to an energy sufficient to surmount the barrier energy of said gate oxide and thereby inject said electrons onto said floating gate.

3. The adaptable MOS current mirror of claim 1 wherein said second control signal is a monotonic function of the difference between the actual output current of said current mirror and said desired output current, whereby said adaptable current mirror operates to make said actual output current equal to said desired output current.

4. The adaptable MOS current mirror of claim 1 wherein said electron removal means comprises an electron tunneling device having an anode connected to said means for generating a first control signal and a cathode connected to said floating node and wherein said electron injecting means comprises a gated-bipolar transistor having a gate connected to said floating node, a collector connected to a first source of electrical potential, an emitter connected to a second source of electrical potential, said second source of electrical potential having a magnitude less than that of said first source of electrical potential, and a base connected to said means for generating a second control signal.

5. An adaptable circuit, communicating with a plurality of current-carrying lines, for indicating the output of the one of said plurality of current-carrying lines through which the most current is flowing, including:

a plurality of capacitor coupled MOS current mirrors, each of said current mirrors including an input node, an output node, a driving MOS current mirror transistor and a driven MOS current mirror transistor, the sources of each driving MOS current mirror transistor and each driven MOS current mirror transistor connected to a source of fixed positive voltage, the gate and drain of each of said driving MOS current mirror transistors comprising said input node and connected to a different one of said current carrying lines and to a first electrode of an MOS capacitor, the gate of said driven MOS current mirror transistor connected to a floating node, the second electrode of said MOS capacitor comprising a portion of said floating node, and the drain of said driven MOS current mirror transistor comprising said output node;

a pulldown transistor associated with each of said current mirrors, each of said pulldown transistors having its source connected to a source of fixed negative voltage, and its gate connected to a common pulldown gate line;

a pulldown gate bias transistor, having its source connected to said source of negative voltage, its gate connected to a source of bias voltage;

a follower transistor associated with each of said current mirrors, each of said follower transistors having its gate connected to the output of the current mirror with which it is associated, and having a source-drain path connected between a source of fixed voltage and said common pulldown gate line;

means, operable during an operating mode of said circuit, for selectively connecting the drain of said pulldown gate bias transistor to said common pulldown gate line, and for enabling said source-drain path of each said follower transistor;

means, operable during an adapting mode of said circuit, for selectively connecting said common pulldown gate line to a source of fixed voltage, for disabling said source-drain path of said follower transistor, and for adjusting the charge on each floating node in response to the voltage at said output node of said current mirror with which it is associated;

whereby the offset voltages of said circuit can be adapted during said adapting mode of said circuit.

* * * * *

UNITED STATES PATENT AND TRADEMARK OFFICE
CERTIFICATE OF CORRECTION

PATENT NO. : 5,160,899
DATED : November 3, 1992
INVENTOR(S) : Janeen D. W. Anderson, Carver A. Mead, Timothy P. Allen, Michael F. Wall It is certified that error appears in the above-indentified patent and that said Letters Patent is hereby corrected as shown below:

In the Drawings:

Drawing FIG. 5A should be as follows:

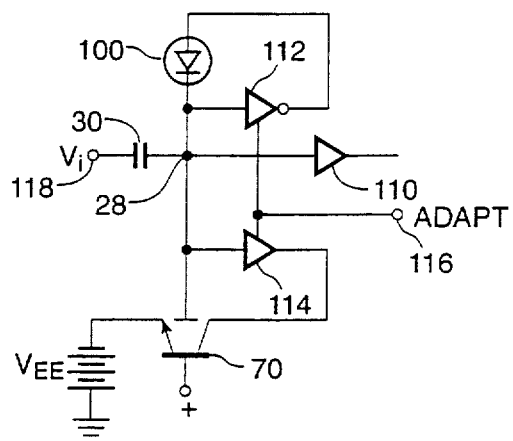

FIG. 5a

UNITED STATES PATENT AND TRADEMARK OFFICE
CERTIFICATE OF CORRECTION

PATENT NO. : 5,160,899
DATED : November 3, 1992
INVENTOR(S) : Janeen D. W. Anderson, Carver A. Mead, Timothy P. Allen, Michael F. Wall It is certified that error appears in the above-indentified patent and that said Letters Patent is hereby corrected as shown below:

Drawing FIG. 5B should be as follows:

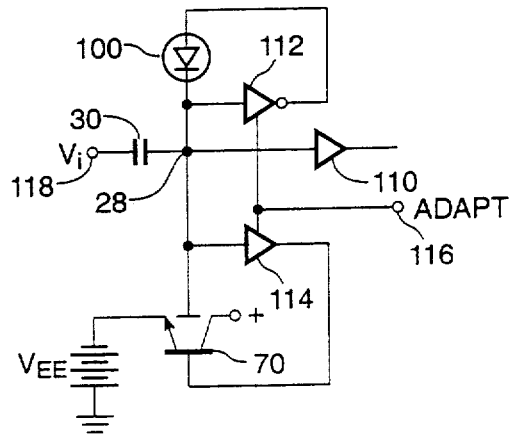

FIG. 5b

UNITED STATES PATENT AND TRADEMARK OFFICE
CERTIFICATE OF CORRECTION

PATENT NO. : 5,160,899

DATED : November 3, 1992

INVENTOR(S) : Janeen D. W. Anderson, Carver A. Mead, Timothy P. Allen, Michael F. Wall It is certified that error appears in the above-indentified patent and that said Letters Patent is hereby corrected as shown below:

Drawing FIG. 5C should be as follows:

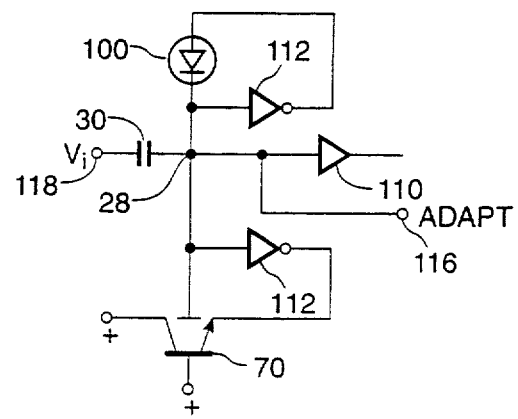

FIG. 5c

UNITED STATES PATENT AND TRADEMARK OFFICE
CERTIFICATE OF CORRECTION

PATENT NO. : 5,160,899

DATED : November 3, 1992

INVENTOR(S) : Janeen D. W. Anderson, Carver A. Mead, Timothy P. Allen, Michael F. Wall It is certified that error appears in the above-indentified patent and that said Letters Patent is hereby corrected as shown below:

Column 8, line 56, replace "114" with --112--.

Signed and Sealed this

Second Day of July, 1996

Attest:

BRUCE LEHMAN

Attesting Officer

Commissioner of Patents and Trademarks